(12) United States Patent
Kawai

(10) Patent No.: US 11,044,815 B2
(45) Date of Patent: Jun. 22, 2021

(54) METHOD FOR MANUFACTURING RESIN STRUCTURE, AND RESIN STRUCTURE

(71) Applicant: OMRON Corporation, Kyoto (JP)

(72) Inventor: Wakahiro Kawai, Konan (JP)

(73) Assignee: OMRON Corporation, Kyoto (JP)

( * ) Notice: Subject to any disclaimer, the term of this patent is extended or adjusted under 35 U.S.C. 154(b) by 39 days.

(21) Appl. No.: 16/613,109

(22) PCT Filed: Feb. 16, 2018

(86) PCT No.: PCT/JP2018/005488
§ 371 (c)(1),
(2) Date: Nov. 12, 2019

(87) PCT Pub. No.: WO2019/016989
PCT Pub. Date: Jan. 24, 2019

(65) Prior Publication Data
US 2021/0084767 A1    Mar. 18, 2021

(30) Foreign Application Priority Data
Jul. 19, 2017   (JP) .............................. JP2017-140112

(51) Int. Cl.
*H05K 1/11*   (2006.01)
*H05K 3/00*   (2006.01)
(Continued)

(52) U.S. Cl.
CPC ....... *H05K 3/0014* (2013.01); *B29C 45/1679* (2013.01); *H05K 1/0326* (2013.01);
(Continued)

(58) Field of Classification Search
CPC ................ H05K 1/0284; H05K 1/119; H05K 3/0011–0055
See application file for complete search history.

(56) References Cited

U.S. PATENT DOCUMENTS

2013/0235545 A1   9/2013  Ohmi
2014/0014400 A1   1/2014  Mori
2015/0156873 A1   6/2015  Yoshioka

FOREIGN PATENT DOCUMENTS

JP   H11-312849   11/1999
JP   2001-196705   7/2001
(Continued)

OTHER PUBLICATIONS

"International Search Report (Form PCT/ISA/210) of PCT/JP2018/005488," dated Apr. 17, 2018, with English translation thereof, pp. 1-4.
(Continued)

Primary Examiner — Jeremy C Norris
(74) Attorney, Agent, or Firm — JCIPRNET

(57) ABSTRACT

This method for manufacturing a resin structure (1) is provided with: a step for arranging a sheet (30) having a smooth surface (31) having a maximum height roughness of 3 μm or less, inside a forming mold (40) such that the smooth surface (31) faces an internal space (44) of the forming mold (40); a step for molding a resin molded body (10) to which the sheet (30) is adhered, by filling the internal space (44) with a resin; a step for separating the resin molded body (10) from the sheet (30), thereby forming a first region (11) having a maximum height roughness of 3 μm or less on at least a portion of the surface of the resin molded body (10); and a step for using a fluid conductive ink to form a wiring (20) on the first region (11).

20 Claims, 6 Drawing Sheets

(51) Int. Cl.
    *B29C 45/16*     (2006.01)
    *H05K 3/12*     (2006.01)
    *H05K 1/09*     (2006.01)
    *H05K 1/03*     (2006.01)
    *B29K 69/00*     (2006.01)
    *B29K 667/00*     (2006.01)
    *B29L 31/34*     (2006.01)

(52) U.S. Cl.
    CPC ............. *H05K 1/092* (2013.01); *H05K 1/119* (2013.01); *H05K 3/125* (2013.01); *B29K 2069/00* (2013.01); *B29K 2667/003* (2013.01); *B29L 2031/3425* (2013.01); *H05K 2201/0145* (2013.01)

(56) References Cited

FOREIGN PATENT DOCUMENTS

| | | |
|---|---|---|
| JP | 2004-006829 | 1/2004 |
| JP | 2006-229115 | 8/2006 |
| JP | 2007086330 | 4/2007 |
| JP | 2010-272756 | 12/2010 |
| JP | 2012-136769 | 7/2012 |
| JP | 2014-077081 | 5/2014 |
| JP | 2017-034150 | 2/2017 |
| WO | 2014-073417 | 5/2014 |
| WO | 2017026490 | 2/2017 |

OTHER PUBLICATIONS

"Written Opinion (Form PCT/ISA/237) of PCT/JP2018/005488," dated Apr. 17, 2018, with English translation thereof, pp. 1-6.
"Search Report of Europe Counterpart Application", dated Mar. 19, 2021, p. 1-p. 8.

US 11,044,815 B2

METHOD FOR MANUFACTURING RESIN STRUCTURE, AND RESIN STRUCTURE

CROSS-REFERENCE TO RELATED APPLICATION

This application is a 371 application of the international PCT application serial no. PCT/JP2018/005488, filed on Feb. 16, 2018, which claims the priority benefits of Japan application no. 2017-140112, filed on Jul. 19, 2017. The entirety of each of the abovementioned patent applications is hereby incorporated by reference herein and made a part of this specification.

TECHNICAL FIELD

The present disclosure relates to a method for manufacturing a resin structure with a wiring formed on a surface thereof and the resin structure.

BACKGROUND ART

In recent years, there has been increased demand for a decrease in the thickness, size, and weight of a sensor and the like needed in a wearable electronic device or an Internet-of-Things (IoT) system. In order to satisfy such a demand, ultra-small electronic circuits have been intensively developed.

As a technology for responding to a demand for small-sized electronic circuits, there is a molded injection device (MID) method for forming a wiring by electrolytic plating or electroless plating on a surface of a resin molded body molded through injection molding or the like. However, the MID method has a problem that chemicals, waste solutions, and the like therefrom become an environmental burden.

As a method for addressing such an environmental problem, Japanese Patent Laid-Open No. 2001-196705 (Patent Literature 1) proposes a method for forming a wiring by forming a groove on a surface of a resin molded body and pouring a conductive material into the groove. However, it is necessary to prepare a forming mold with a complicated shape for forming the groove, this leading to an increase in manufacturing costs and a limited circuit design.

In order to minimize manufacturing costs incurred for a forming mold and to improve a degree of freedom in circuit design, a technology for forming a wiring by ejecting a fluid conductive ink onto a surface of a resin molded body using ink-jet printing has been developed. For example, Japanese Patent Laid-Open No. 2010-272756 (Patent Literature 2) discloses a technology according to which a sheet with electronic components attached thereto is disposed in a forming mold to mold a resin molded body and a wiring is formed on a surface of the resin molded body that has been exposed by the sheet being peeled off from the resin molded body. International Publication No. 2014/073417 (Patent Literature 3) discloses a technology for forming a wiring after forming an ink receiving layer on a surface of a resin molded body by ink-jet printing.

REFERENCE LIST

Patent Literature

Patent Literature 1: Japanese Patent Laid-Open No. 2001-196705
Patent Literature 2: Japanese Patent Laid-Open No. 2010-272756
Patent Literature 3: International Publication No. 2014/073417
Patent Literature 4: Japanese Patent Laid-Open No. 2014-77081

SUMMARY

Technical Problem

A resin molded body is obtained by filling a cavity of a forming mold with a molten resin and curing the molten resin. Machining marks or scratching formed during the manufacturing of the forming mold is present on an inner surface of the forming mold. Therefore, such machining marks or scratching is transferred to the surface of the resin molded body. FIG. 10 is a plan view illustrating an outline structure of a resin structure according to a reference example. FIG. 11 is a sectional view seen in the direction of the arrow of the line X-X in FIG. 10. As illustrated in FIGS. 10 and 11, the resin structure 100 includes a resin molded body 110 molded using a forming mold with machining marks remaining thereon and a wiring 120 formed on an upper surface 112 of the resin molded body 110. A plurality of grooves corresponding to the machining marks on the forming mold are formed in the upper surface 112. If a fluid conductive ink is ejected onto the upper surface 112 by ink-jet printing, a part of the conductive ink is likely to move along the grooves in the upper surface 112. Therefore, bleeding 112 of the conductive ink occurs, and the width of the wiring 120 varies depending on locations, as illustrated in FIG. 10.

A method of mirror-finishing an inner surface of the forming mold by polishing the inner surface with a whetstone or the like, a method of plating chromium or the like on the inner surface of the forming mold, and the like are conceivable in order to minimize such variations in width of the wiring 120. However, such working leads to an increase in costs required for the forming mold. Further, it is necessary to manage the forming mold in order to prevent scratching from being generated on the inner surface of the forming mold during utilization of the forming mold, and in a case in which scratching still occurs, time and effort are required to perform a repairing operation of the forming mold.

According to the technology disclosed in Japanese Patent Laid-Open 2010-272756, a sheet is interposed between a forming mold and a resin molded body. Therefore, machining marks on the forming mold are unlikely to be transferred to the surface of the resin molded body. However, an adhesive is applied to the sheet to attach electronic components, and irregularities on the surface of the adhesive are transferred to the surface of the resin molded body. Therefore, the width of the wiring tends to vary similarly to the resin structure 100 illustrated in FIG. 10.

According to the technology disclosed in International Publication No. 2014/073417, bleeding of the conductive ink is suppressed, and the width of the wiring is stabilized, since the ink receiving layer is formed as a base layer of the wiring. However, manufacturing processes become complicated, and manufacturing costs increase, in order to form the ink receiving layer by ink-jet printing.

The present disclosure was made in view of the aforementioned problems, and an objective thereof is to provide a method for manufacturing a resin structure and a resin structure in which an increase in manufacturing costs and variation in width of the wiring are able to be suppressed.

Solution to Problem

According to an aspect, there is provided a method for manufacturing a resin structure including: a step for arranging a sheet having a smooth surface having a maximum height roughness Rz of 3 μm or less, inside a forming mold such that the smooth surface faces an internal space of the forming mold; a step for molding a resin molded body to which the sheet is adhered, by filling the internal space with a resin; a step for separating the resin molded body from the sheet, thereby forming a region having a maximum height roughness Rz of 3 μm or less on at least a portion of the surface of the resin molded body; and a step for using a fluid conductive ink to form a wiring on the region.

According to another aspect, there is provided a method for manufacturing a resin structure including: a step for forming a functional layer on a first smooth surface having a maximum height roughness Rz of 3 μm or less of a sheet having the first smooth surface; a step for arranging the sheet with the functional layer formed thereon inside a forming mold such that the functional layer faces an internal space of the forming mold; a step for molding a resin molded body to which the sheet and the functional layer are adhered, by filling the internal space with a resin; a step for separating the functional layer from the sheet in a state in which the functional layer is adhered to the resin molded body, thereby exposing a second smooth surface having a maximum height roughness Rz of 3 μm or less of the functional layer; and a step for using a fluid conductive ink to form a wiring on the second smooth surface. The functional layer is, for example, a dielectric layer having a specific permittivity of 5 or more.

Preferably, in the step for forming the wiring, the conductive ink is ejected by ink-jet printing.

Preferably, when a tensile stress of 100 kgf/cm² is applied to the sheet in an environment at 120° C., an extension rate of the sheet is 1% or less, and an amount of deformation of the sheet in a thickness direction is 10% or less.

Preferably, the sheet has a thickness of 50 to 120 μm and is made of polyethylene terephthalate.

According to another aspect, there is provided a resin structure including: a resin molded body; and a wiring that is formed on a surface of the resin molded body. The surface of the resin molded body includes a first region having a maximum height roughness Rz of 3 μm or less and a second region that is adjacent to the first region and has a maximum height roughness Rz of more than 3 μm. A step difference due to which the first region is lower than the second region is formed at a boundary between the first region and the second region. The wiring is formed on the first region.

According to another aspect, there is provided a resin structure including: a resin molded body; a functional layer that is formed on a first region that is a portion of a surface of the resin molded body; and a wiring that is formed on the functional layer.

The surface of the functional layer on which the wiring is formed is a smooth surface having a maximum height roughness Rz of 3 μm or less. A maximum height roughness Rz in a second region that is adjacent to the first region on the surface of the resin molded body is more than 3 μm. A step difference due to which the smooth surface is lower than the second region is formed at a boundary between the first region and the second region. The functional layer is, for example, a dielectric layer having a specific permittivity of 5 or more.

Advantageous Effects of Invention

According to the present disclosure, it is possible to suppress an increase in manufacturing costs and to suppress variation in width of a wiring.

Figure 3:
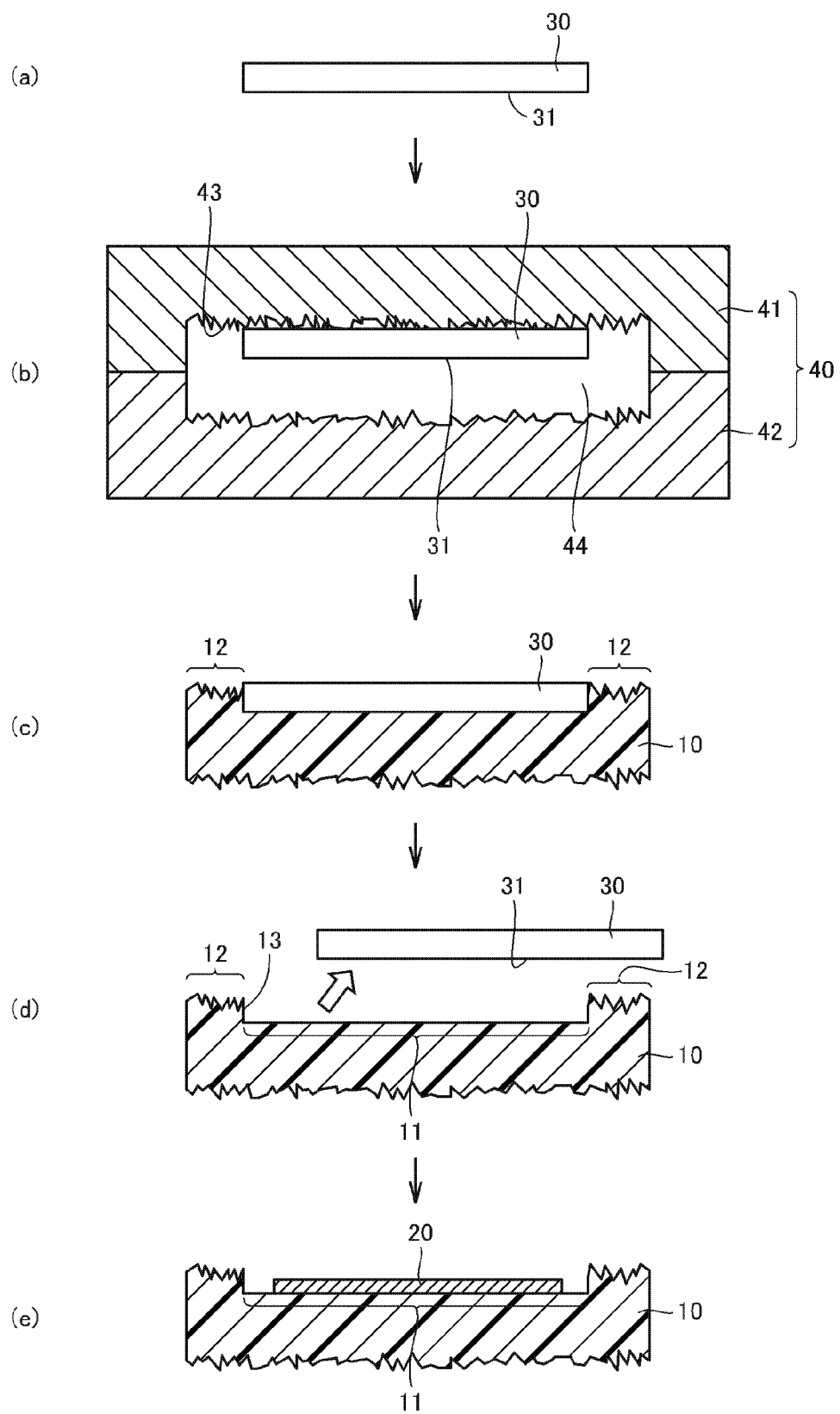

(a) to (e) of FIG. 3 are diagrams for explaining a method for manufacturing the resin structure according to the first embodiment.

Figure 4:
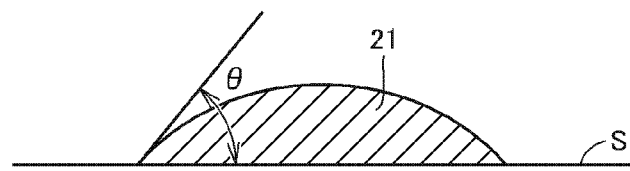

FIG. 4 is a diagram illustrating a relationship between a solvent contained in a conductive ink and a contact angle.

Figure 5:
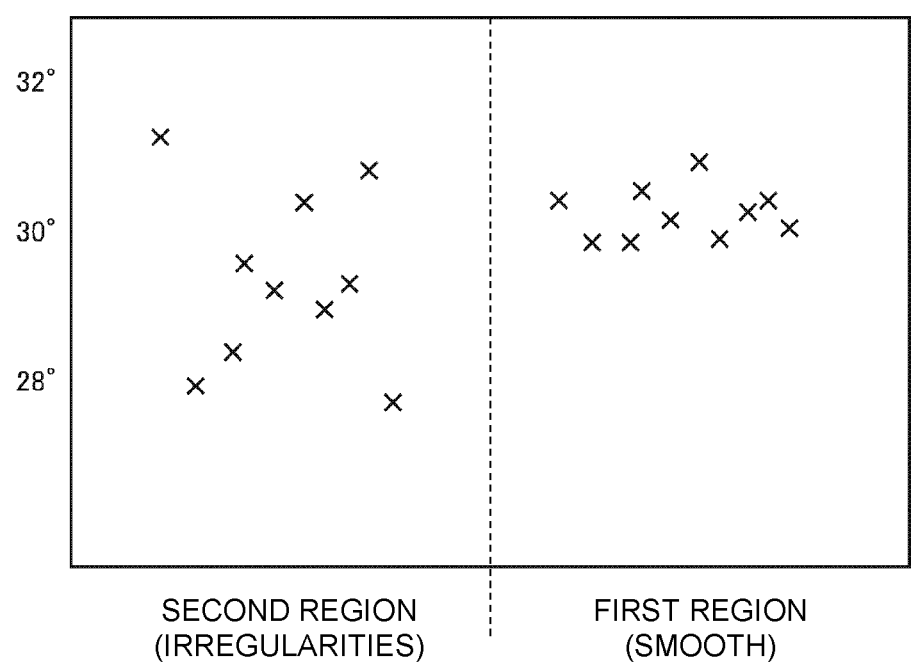

FIG. 5 is a diagram illustrating a result of measuring a contact angle when a solvent contained in the conductive ink is dropped onto each of a second region and a first region.

Figure 6:
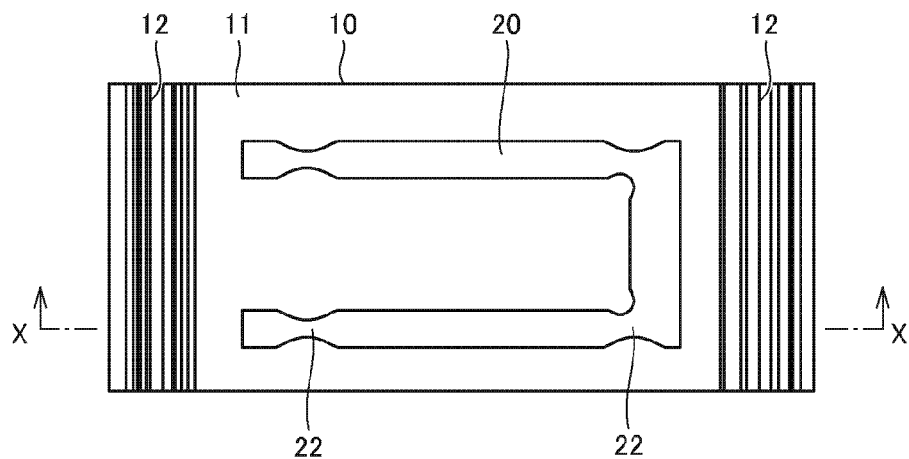

FIG. 6 is a plan view illustrating a resin structure manufactured using a sheet in which rolling has occurred.

Figure 7:
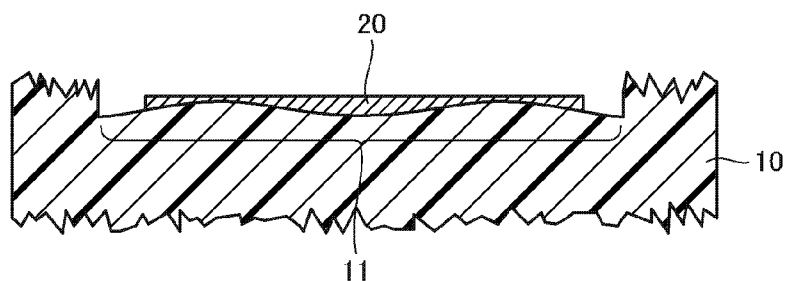

FIG. 7 is a sectional view when seen in the direction of the arrow of the line X-X in FIG. 6.

Figure 8:
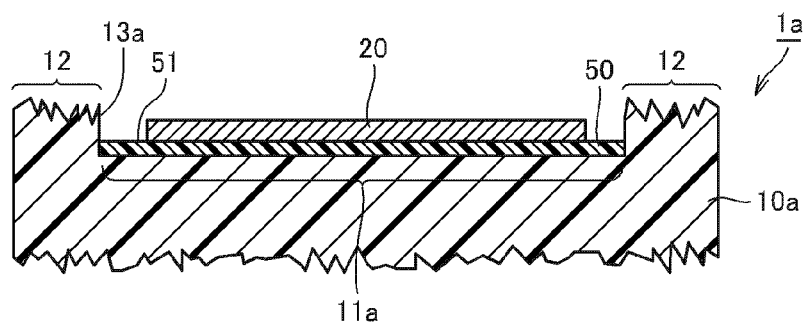

FIG. 8 is a sectional view illustrating an outline structure of a resin structure according to a second embodiment.

Figure 9:
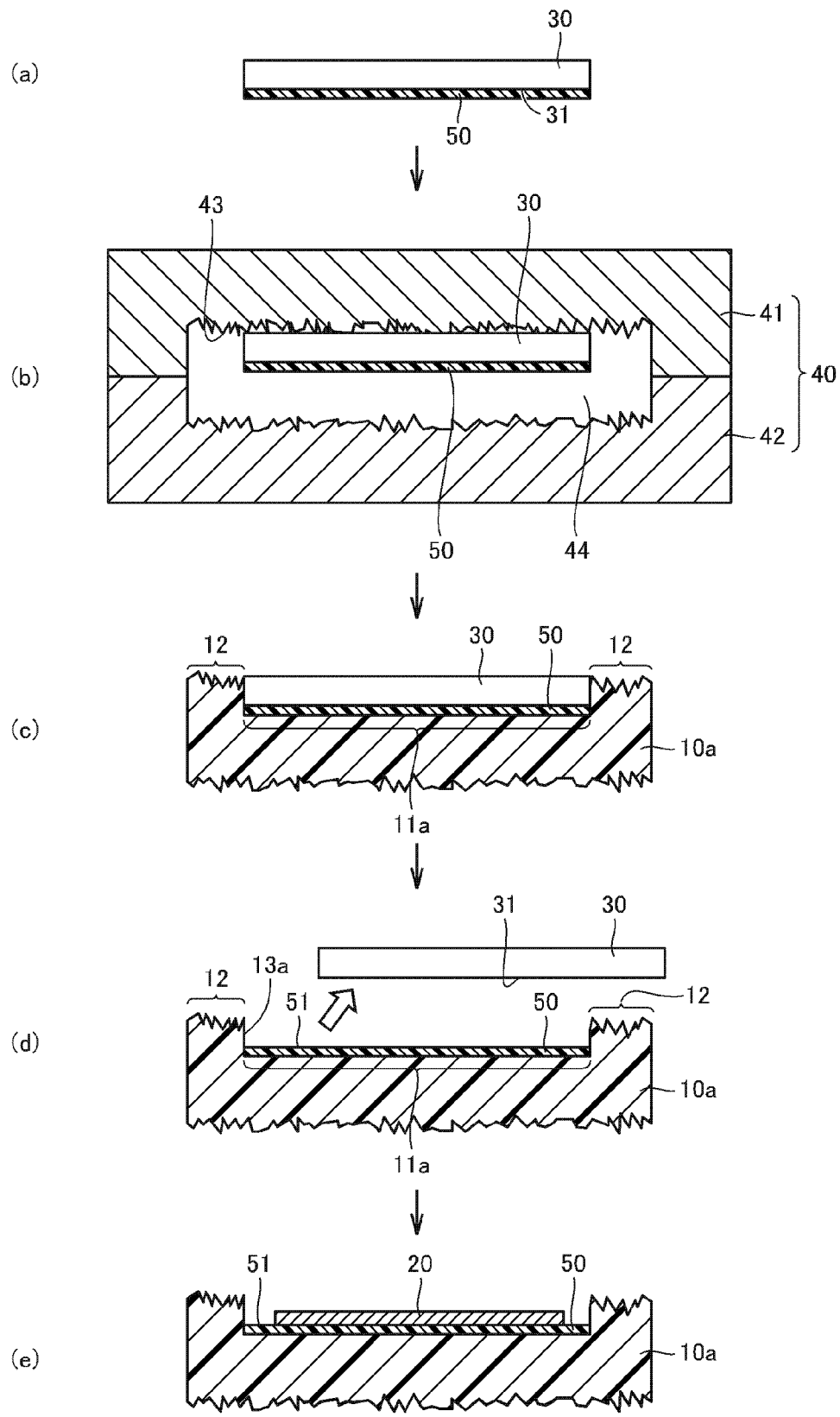

(a) to (e) of FIG. 9 are diagrams for explaining a method for manufacturing the resin structure according to the second embodiment.

Figure 10:
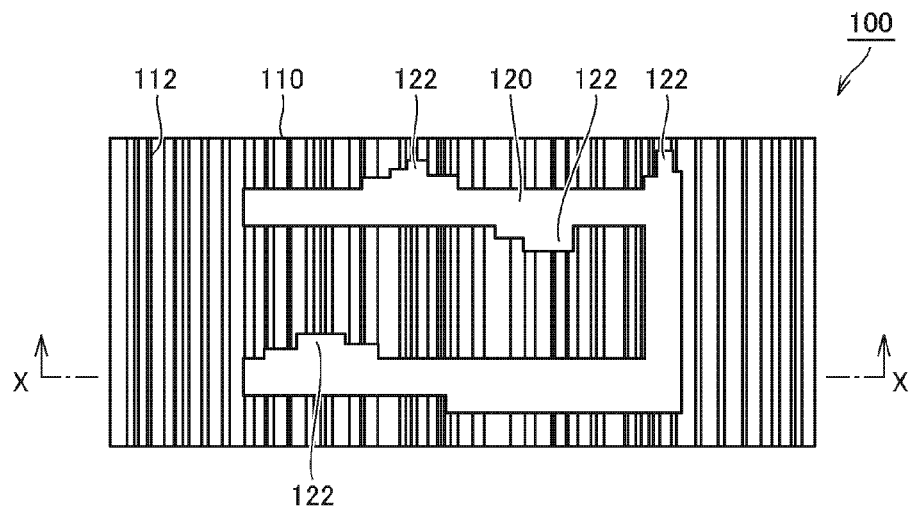

FIG. 10 is a plan view illustrating an outline structure of a resin structure according to a reference example.

Figure 11:
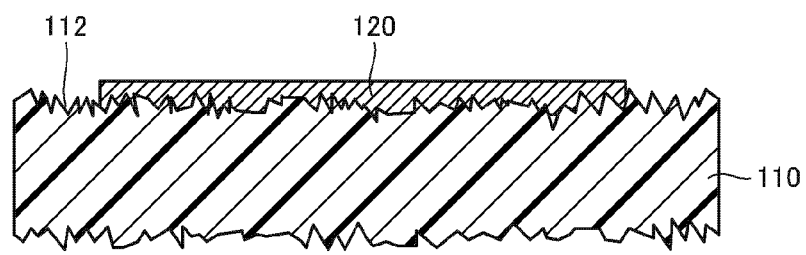

FIG. 11 is a sectional view when seen in a direction of the arrow of the line X-X in FIG. 10.

DESCRIPTION OF THE EMBODIMENTS

Embodiments of the invention will be described in detail with reference to the drawings. Also, the same reference numerals will be given to the same or corresponding parts in the drawings, and description thereof will not be repeated. In addition, the embodiments or modification examples described below may be arbitrarily and selectively combined.

First Embodiment

Configuration of Resin Structure

Figure 1:
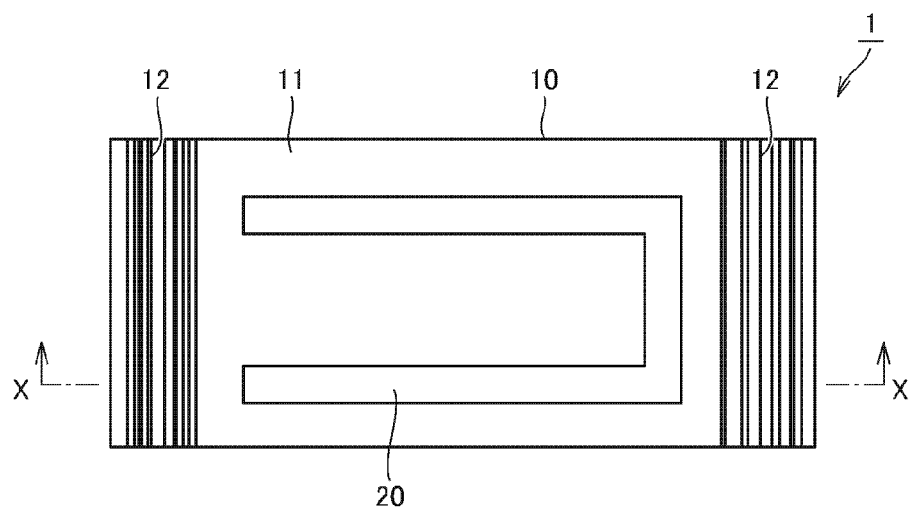
FIG. 1 is a plan view illustrating an outline configuration of a resin structure according to a first embodiment.
Figure 2:
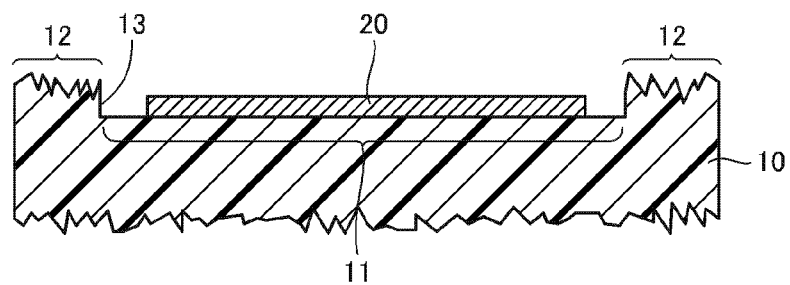
FIG. 2 is a sectional view when seen in the direction of the arrow of the line X-X in FIG. 1.

Referring to FIGS. 1 and 2, an outline configuration of a resin structure 1 according to a first embodiment will be described. FIG. 1 is a plan view illustrating an outline configuration of the resin structure 1 according to the first embodiment. FIG. 2 is a sectional view when seen in the direction of the arrow of the line X-X in FIG. 1.

The resin structure 1 is incorporated in an electronic device such as a wearable mobile device and carries out main or auxiliary functions of the electronic device.

As illustrated in FIGS. 1 and 2, the resin structure 1 includes a resin molded body 10 and a wiring 20 that is formed on a surface of the resin molded body 10.

The resin molded body 10 has a substantially plate shape and is made of a resin such as polycarbonate (PC), or acrylonitrile butadiene styrene (ABS). Also, the shape of the resin molded body 10 is not particularly limited. The material of the resin molded body 10 may be another type of resin. In a case that the resin structure 1 is incorporated in a wearable mobile device, for example, the resin molded body 10 may be made of a stretchable and deformable resin material (for example, an elastomer that is an elastic rubber polymer substance such as a polyester-based elastomer, a styrene-based elastomer, or an olefin-based elastomer).

A surface of the resin molded body 10 includes a first region 11 having a maximum height roughness Rz of 3 μm or less and a second region 12 having a maximum height roughness Rz of more than 3 μm. The maximum height roughness Rz is defined by JIS B0601:2013. The maximum height roughness Rz is measured along a plurality of directions (for example, six directions at intervals of 30°) in a plane of the first region 11, and the maximum value thereof is assumed to be "the maximum height roughness Rz of the first region 11". Similarly, the maximum height roughness Rz is measured along a plurality of directions (for example, six directions at intervals of 30°) in a plane of the second region 12, and the maximum value thereof is assumed to be "the maximum height roughness Rz of the second region 12".

The resin molded body 10 may have an electronic part incorporated therein as disclosed in Japanese Patent Laid-Open No. 2010-272756.

The first region 11 is a region to which a surface of a sheet having a maximum height roughness Rz of 3 μm or less has been transferred, as will be described later.

The second region 12 is adjacent to the first region 11. The second region 12 is a region to which machining marks or scratching on the surface of the forming mold has been transferred and has minute irregularities corresponding to the machining marks or scratching as will be described later. A plurality of grooves, for example, are formed in the second region 12.

A step difference 13 due to which the first region 11 is lower than the second region 12 is formed at a boundary between the first region 11 and the second region 12.

The height of the step difference 13 is 50 μm to 120 μm, for example. It is possible to easily and visually distinguish the first region 11 from the second region 12 by the step difference 13 from being formed.

A wiring 20 is formed on the first region 11 of the resin molded body 10. The wiring 20 is easily formed by dropping a conductive ink containing silver (Ag) fine particles (particle diameters of 10 to 100 nm), and additives, for example, onto the first region 11. As a method of dropping the conductive ink onto the first region, ink-jet printing, spray coating, or the like can be used. In the ink-jet printing, the conductive ink is ejected from a nozzle and is accumulated on the first region 11. The thickness of the wiring 20 is 3 to 5 μm, for example.

Method for Manufacturing Resin Structure

Next, an example of a method for manufacturing the resin structure 1 according to the first embodiment will be described with reference to (a) to (e) of FIG. 3. (a) to (e) of FIG. 3 are diagrams for explaining the method for manufacturing the resin structure 1.

First Process

First, a sheet 30 with a smooth surface 31 having a maximum height roughness Rz of 3 μm or less is prepared as illustrated in (a) of FIG. 3. The sheet 30 has a thickness of 50 to 120 μm, for example, and is made of polyethylene terephthalate (PET). By the sheet 30 having the thickness of 50 to 120 μm and being made of PET, it is possible to prepare the sheet 30 capable of securing strength with respect to tensile stress at low cost.

The sheet 30 may include a plurality of layers. In this case, the maximum height roughness Rz of at least one of surfaces of the outermost layers may be set to 3 μm or less. In a case in which the maximum height roughness Rz of a surface of a layer immediately below the lowermost layer is greater than 3 μm, for example, it is only necessary to form an outer most layer with a surface having a maximum height roughness Rz of 3 μm or less by applying a material with low viscosity to the surface. In a case in which a resin molded body 10 with an electronic part incorporated therein is formed as disclosed in Japanese Patent Laid-Open No. 2010-272756, it is only necessary to prepare a sheet 30 having, as an outermost layer, an adhesive layer that is formed using an adhesive material with low viscosity and that has a surface having a maximum height roughness Rz of 3 μm or less.

Second Process

Next, the sheet 30 prepared in the first process is disposed in a forming mold 40 as illustrated in (b) of FIG. 3. The forming mold 40 includes an upper mold 41 and a lower mold 42. Multiple grooves that are machining marks are formed on an inner surface 43 of the upper mold 41. A maximum height roughness Rz of the surface 43 is greater than 3 μm. Multiple grooves that are machining marks are also formed in an inner surface of the lower mold 42.

The sheet 30 is disposed in the forming mold 40 such that the smooth surface 31 faces an internal space (cavity) 44 of the forming mold 40. Specifically, the sheet 30 is disposed in the forming mold 40 such that a rear surface of the smooth surface 31 of the sheet 30 is brought into contact with the upper mold 41 and the smooth surface 31 faces the lower mold 42, as illustrated in (b) of FIG. 3. In the first embodiment, the sheet 30 is disposed on the surface 43 of the upper mold 41. The size of the sheet 30 is smaller than the size of the surface 43, and the sheet 30 is disposed at the center of the surface 43.

Third Process

Next, a molten resin is injected into the internal space 44 of the forming mold 40, thereby molding the resin molded body 10. Conditions for the injection molding may be arbitrarily selected in accordance with the resin, and in a case in which polycarbonate (PC) is used, for example, the injection molding is performed at an injected resin temperature of 270° C. at an injection pressure of 100 MPa. Various resin materials can be employed as the resin used for the injection molding. The conditions for the injection molding are not particularly limited.

The resin molded body 10 taken out of the forming mold 40 is illustrated in (c) of FIG. 3. The sheet 30 is adhered to the resin molded body 10. The shape of the inner surface of the forming mold 40 is transferred to a portion of the surface of the resin molded body 10, which is not covered with the sheet 30. As described above, multiple grooves that are machining marks are formed on the surface 43 of the forming mold 40, and the maximum height roughness Rz of the surface 43 is greater than 3 μm. Therefore, the second region 12 having the maximum height roughness Rz of more than 3 μm is formed in the surroundings of the sheet 30 on the surface of the resin molded body 10.

Fourth Process

Next, the sheet 30 is peeled off from the resin molded body 10 as illustrated in (d) of FIG. 3. In this manner, the first region 11 that is a region on the surface of the resin molded body 10, which has been adhered to the sheet 30, is exposed. The maximum height roughness Rz of the smooth surface 31 of the sheet 30 that has been adhered to the resin molded body 10 is 3 μm or less. Since the shape of the smooth surface 31 is transferred to the first region 11, the maximum height roughness Rz of the first region 11 also becomes 3 μm or less.

The step difference 13 having a height corresponding to the thickness of the sheet 30 is formed at a boundary between the first region 11 and the second region 12 by causing the sheet 30 to peel off.

Fifth Process

Next, the wiring 20 is formed by dropping a fluid conductive ink onto the first region 11 as illustrated in (e) of FIG. 3. The conductive ink is dropped onto the first region 11 using ink-jet printing, spray coating, or the like.

The conductive ink is, for example, an ink obtained by dispersing Ag fine particles with particle diameters of 10 to 100 μm in a mixture solution of 30 to 50 wt % of water, 1 to 20 wt % of 1,3 propanediol, 1 to 20 wt % of glycerin, and 1 to 20 wt % of glycols. The wiring 20 is formed by dropping the conductive ink onto the first region 11 in a circuit pattern shape and then performing a drying process at 120° C. for about 30 minutes.

A resist may be formed on the wiring 20 in order to prevent oxidation of the wiring 20. The resist is formed by ink-jet printing, for example. However, a method of forming the resist is not particularly limited. In the case in which ink-jet printing is used, it is possible to easily form the resist by selectively ejecting a material ink for the resist onto the wiring 20.

It is possible to manufacture the resin structure 1 illustrated in FIGS. 1 and 2 through the aforementioned first to fifth processes.

FIG. 4 is a diagram illustrating a relationship between a solvent 21 included in the conductive ink and a contact angle θ. The contact angle θ is measured by a sessile drop method by dropping the solvent 21 onto a target surface S. FIG. 5 is a diagram illustrating a result of measuring the contact angle θ when the solvent 21 included in the conductive ink is dropped onto a plurality of locations in each of the second region 12 and the first region 11.

If the surface becomes rough, the solvent 21 that is likely to be wettable with respect to the target surface S is likely to become more wettable, and the solvent 21 that is likely to be repelled by the target surface S is likely to be further repelled. Therefore, variations in contact angle θ in the second region 12 increase as illustrated in FIG. 5. Meanwhile, the variations in contact angle θ in the first region 11 are suppressed within a specific range. In this manner, it is possible to suppress spreading of the wiring 20 due to bleeding of the conductive ink and thinning of the wiring 20 due to repelling of the conductive ink in the case in which the wiring 20 is formed in the first region 11. As a result, it is possible to suppress variations in width of the wiring 20.

Also, in the case in which the wiring 20 is formed with the conductive ink at the contact angle of 30°, the thickness of the wiring 20 is 3 to 4 μm. Therefore, it is possible to suppress disconnection of the wiring 20 by forming the wiring 20 in the first region 11 having the maximum height roughness Rz of 3 μm or less.

The sheet 30 prepared in the aforementioned first process preferably has properties that an extension rate is 1% or less and the amount of deformation in the thickness direction is 10% or less when a tensile stress of 100 kgf/cm$^2$ is applied in an environment at 120° C. The sheet 30 with such properties can be easily prepared using PET.

It is possible to suppress stretching and deformation in the thickness direction of the sheet 30 that has been brought into contact with the molten resin in the third process using the sheet 30 with the aforementioned properties. In this manner, it is possible to suppress rolling of the sheet 30 in the forming mold 40.

FIG. 6 is a plan view illustrating a resin structure manufactured using a sheet 30 in which rolling has occurred. FIG. 7 is a sectional view seen in the direction of the arrow of the line X-X in FIG. 6. In the case in which rolling has occurred in the sheet 30, the rolling is transferred to the first region 11. If there is rolling in the first region 11, the conductive ink flows along an inclination of the rolling, and the amount of conductive ink at the top of the rolling decreases. Therefore, a thin part 22 is generated at the wiring 20 as illustrated in FIG. 6. However, it is possible to further suppress variations in width of the wiring 20 due to the rolling in the first region 11 by using the sheet 30 with the aforementioned properties.

Also, the sheet 30 with the same size as the surface 43 of the upper mold 41 may be disposed on the surface 43 in the aforementioned second process. In this case, the step difference 13 is not formed.

As described above, the method for manufacturing the resin structure 1 according to the first embodiment includes at least the second to fifth processes. In the second process, the sheet 30 with the smooth surface 31 having the maximum height roughness Rz of 3 μm or less is disposed in the forming mold 40 such that the smooth surface 31 faces the internal space 44 of the forming mold 40. In the third process, the internal space 44 is filled with a resin, thereby molding the resin molded body 10 to which the sheet 30 is adhered. In the fourth process, the sheet 30 is peeled off from the resin molded body 10, thereby forming the first region 11 having the maximum height roughness Rz of 3 μm or less on at least a part of the surface of the resin molded body 10. In the fifth process, the wiring 20 is formed on the first region 11 using the fluid conductive ink.

With the aforementioned configuration, the wiring 20 is formed on the first region 11 having the maximum height roughness Rz of 3 μm or less. In this manner, it is possible to reduce variations in contact angle of the conductive ink in the first region 11. As a result, partial bleeding or repelling of the conductive ink is suppressed, and it is thus possible to suppress variations in width of the wiring 20. Further, since neither formation of the ink receiving layer as disclosed in International Publication No. 2014/073417 by ink-jet printing nor mirror-finishing of the forming mold 40 is needed, it is possible to suppress an increase in manufacturing costs. As described above, it is possible to suppress an increase in manufacturing costs and to suppress variations in width of the wiring 20.

In the process of forming the wiring 20, the conductive ink is ejected by ink-jet printing. In this manner, it is possible to easily form the wiring 20. Further, a degree of freedom in pattern design of the wiring 20 increases. The thickness of the wiring 20 obtained in printing of the conductive ink performed once by the ink-jet printing is as thin as 0.5 μm to 5 µm. However, since the maximum height roughness Rz of the first region 11 is 3 µm or less, it is possible to suppress occurrence of disconnection of the wiring 20 by printing performed a small number of times (one to six times).

When a tensile stress of 100 kgf/cm$^2$ is applied to the sheet 30 in an environment at 120° C., the extension rate of the sheet 30 is preferably 1% or less, and the amount of deformation of the sheet 30 in the thickness direction is preferably 10% or less. In this manner, it is possible to suppress occurrence of rolling of the sheet 30 disposed in the forming mold 40. As a result, rolling in the first region 11 is suppressed, and variations in width of the wiring 20 due to rolling can also be suppressed.

The sheet 30 preferably has a thickness of 50 to 120 µm and is preferably made of polyethylene terephthalate. In this manner, it is possible to prepare the sheet 30 capable of securing strength with respect to tensile stress at low cost.

The resin structure 1 according to the first embodiment includes the resin molded body 10 and the wiring 20 formed on the surface of the resin molded body 10. The surface of the resin molded body 10 includes the first region 11 having the maximum height roughness Rz of 3 µm or less and the second region 12 that is adjacent to the first region 11 and has the maximum height roughness Rz of more than 3 µm. The step difference 13 due to which the first region 11 is lower than the second region 12 is formed at the boundary between the first region 11 and the second region 12. The wiring 20 is formed on the first region 11.

In this manner, partial bleeding or repelling of the conductive ink is suppressed, and it is thus possible to suppress variations in width of the wiring 20. Further, since neither formation of the ink receiving layer as disclosed in International Publication No. 2014/073417 by ink-jet printing nor mirror finishing of the forming mold is needed, it is possible to suppress an increase in manufacturing costs of the resin structure 1. Further, it is possible to easily check the boundary between the first region 11 and the second region 12 by the step difference 13. Therefore, it is possible to prevent the wiring 20 from being erroneously formed in the second region 12.

Second Embodiment

Although the wiring 20 is formed on the first region 11 that is the surface of the resin molded body 10 in the first embodiment, a functional layer may be provided between the resin molded body 10 and the wiring 20.

Japanese Patent Laid-Open No. 2014-77081 (Patent Literature 4) discloses a technology for forming a functional layer with a high dielectric constant containing barium titanate or the like with a specific permittivity of 200 or more by ink-jet printing. In order to apply the technology to a resin molded body with a three-dimensional shape, an ink jet printing device and a device for performing a drying treatment and a light irradiation treatment for curing the ink increase in size, and this leads to an increase in manufacturing costs. According to the method for manufacturing a resin structure in the second embodiment, it is possible to easily form such a functional layer.

FIG. 8 is a sectional view illustrating an outline structure of a resin structure 1a according to the second embodiment. As illustrated in FIG. 8, the resin structure 1a includes a resin molded body 10a, a functional layer 50 that is formed on a first region 11a that is a part of a surface of the resin molded body 10a, and a wiring 20 that is formed on the functional layer 50.

The resin molded body 10a has a substantially plate shape similarly to the resin molded body 10 illustrated in FIG. 1 and is made of a resin such as polycarbonate (PC) or acrylonitrile butadiene styrene (ABS). However, the shape and the material of the resin molded body 10a are not particularly limited. The resin molded body 10a may have an electronic component incorporated therein as disclosed in Japanese Patent Laid-Open No. 2010-272756.

The surface of the resin molded body 10a includes the first region 11a on which the functional layer 50 is formed and a second region 12 having a maximum height roughness Rz of more than 3 µm. The second region 12 is adjacent to the first region 11.

A step difference 13a due to which a smooth surface 51 that is an upper surface of the functional layer 50 is lower than the second region 12 is formed at a boundary between the first region 11a and the second region 12. The height of the step difference 13a is 50 µm to 120 µm, for example. It is possible to easily and visually distinguish the first region 11a from the second region 12 by the step difference 13a from being formed.

The functional layer 50 is made of a material that is difference from that of the resin molded body 10a and has functions that are different from those of the resin molded body 10a. The functional layer 50 is formed on the first region 11a. The maximum height roughness Rz of the smooth surface 51 that is an upper surface of the functional layer 50 is 3 µm or less. Although the thickness of the functional layer 50 is not particularly limited, the thickness is from 10 nm to 10 µm, for example.

The wiring 20 is formed on the smooth surface 51 of the functional layer 50. The wiring 20 is easily formed by dropping a conductive ink that contains silver (Ag) fine particles (particle diameter of 10 to 100 nm) and additives to the smooth surface 51 of the functional layer 50 by ink-jet printing or spray coating, for example.

The functional layer 50 is, for example, a dielectric layer (high-dielectric layer) with a specific permittivity of 5 or more, a dielectric layer (low-dielectric layer) with a specific permittivity of 2 or less, a dielectric layer (low-dissipation factor layer) of a dissipation factor of 0.003 or less, an ink receiving layer such as a primer, or the like.

In order to reduce the size of the electronic circuit, a transmission wavelength of an electrical signal is preferably shortened. In a case in which polycarbonate with a specific permittivity of 2 to 3 is used as a material of the resin molded body 10a, and the wiring 20 is formed on the surface of the resin molded body 10a, it is not possible to sufficiently shorten the wavelength to be transmitted through the wiring 20. However, it is possible to sufficiently shorten the wavelength of the signal to be transmitted through the wiring 20 formed on the functional layer 50 by forming the functional layer 50 as a high dielectric layer.

It is possible to reduce a signal loss in a high-frequency circuit formed by the wiring 20 by forming the functional layer 50 as a low dielectric layer or a low dissipation factor layer.

It is possible to further suppress bleeding or repelling of the conductive ink when the wiring 20 is formed by ink-jet printing, by forming the functional layer 50 as an ink receiving layer of a material disclosed in International Publication No. 2014/073417.

Method for Manufacturing Resin Structure

Next, an example of a method for manufacturing the resin structure 1a according to the second embodiment will be described with reference to (a) to (e) of FIG. 9. (a) to (e) of FIG. 9 are diagrams for explaining the method for manufacturing the resin structure 1a.

First Process

First, the sheet 30 with the smooth surface 31 having a maximum height roughness Rz of 3 μm or less is prepared similarly to the first process in the first embodiment. Then, the functional layer 50 is formed on the smooth surface 31 by ink-jet printing as illustrated in (a) of FIG. 9.

In a case in which the functional layer 50 that is a high dielectric layer is formed, for example, an ink obtained by oxide particles (for example, barium titanate) of a dielectric material with a specific permittivity of 200 or more are dispersed in a glycol ether-based solvent is applied to the smooth surface 31 by ink-jet printing. Thereafter, the ink is cured with light energy, thereby forming the functional layer 50 with a thickness of 10 nm to 10 μm and a specific permittivity of 5 or more.

Second Process

Next, the sheet 30 prepared in the first process is disposed in the forming mold 40 as illustrated in (b) of FIG. 9. The sheet 30 is disposed in the forming mold 40 such that the functional layer 50 faces the internal space 44 of the forming mold 40. Specifically, the sheet 30 is disposed in the forming mold 40 such that the sheet 30 is brought into contact with the surface 43 of the upper mold 41 and the functional layer 50 faces the lower mold 42. Multiple grooves that are machining marks are also formed in the surface 43 in the second embodiment. Also, the size of the sheet 30 is smaller than the size of the surface 43 of the upper mold 41, and the sheet 30 is disposed at the center of the surface 43.

Third Process

Next, a molten resin is injected into the internal space 44 of the forming mold 40, thereby molding the resin molded body 10a. The process is similar to the third process in the first embodiment.

The resin molded body 10a taken out of the forming mold 40 is illustrated in (c) of FIG. 9. The sheet 30 and the functional layer 50 are adhered to the resin molded body 10a. A region of the surface of the resin molded body 10a which is adhered to the functional layer 50 is the first region 11a on which the functional layer 50 is formed.

Similarly to the first embodiment, a region of the surface of the resin molded body 10a, which is not covered with the sheet 30, is the second region 12, to which the grooves of the machining marks formed on the surface 43 of the forming mold 40 are transferred, which has a maximum height roughness Rz of more than 3 μm.

Fourth Process

Next, the sheet 30 is peeled off from the functional layer 50 as illustrated in (d) of FIG. 9. A securing force between the resin molded body 10a and the functional layer 50 is stronger than a securing force between the smooth surface 31 of the sheet 30 having the maximum height roughness Rz of 3 μm or less and the functional layer 50. Therefore, it is possible to cause the sheet 30 to peel off from the functional layer 50 with the functional layer 50 remaining on the resin molded body 10a. In this manner, the smooth surface 51 of the functional layer 50 is exposed. The maximum height roughness Rz of the smooth surface 31 that has adhered to the functional layer 50 is 3 μm or less. Since the shape of the smooth surface 31 is transferred to the functional layer 50, the maximum height roughness Rz of the smooth surface 51 of the functional layer 50 is also 3 μm or less.

The step difference 13a with a height corresponding to the thickness of the sheet 30 is formed at a boundary between the second region 12 and the first region 11a by causing the sheet 30 to peel off.

Fifth Process

Next, the wiring 20 is formed by dropping the conductive ink to the smooth surface 51 of the functional layer 50 as illustrated in (e) of FIG. 9. The conductive ink is dropped to the smooths surface 51 of the functional layer 50 using ink-jet printing, spray coating, or the like similarly to the fifth process in the first embodiment. Further, a resist may be formed on the wiring 20 in order to prevent oxidation of the wiring 20.

The resin structure 1a illustrated in FIG. 8 can be manufactured by the aforementioned first to fifth processes. The wiring 20 is also formed on the smooth surface 51 having a maximum height roughness Rz of 3 μm or less in the second embodiment. In this manner, variations in contact angle θ of the wiring 20 with respect to the smooth surface 51 are suppressed within a specific range, and it is possible to suppress spreading of the wiring 20 due to bleeding of the conductive ink and thinning of the wiring 20 due to repelling of the conductive ink. That is, it is possible to suppress variations in width of the wiring 20.

Further, since the functional layer 50 is provided between the wiring 20 and the resin molded body 10a, it is possible to exhibit functions in accordance with materials of the functional layer 50.

As describe above, the method for manufacturing the resin structure 1a according to the second embodiment includes at least the first to fifth processes. In the first process, the functional layer 50 is formed on the smooth surface 31 of the sheet 30 with the smooth surface (first smooth surface) 31 having the maximum height roughness Rz of 3 μm or less. In the second process, the sheet 30 with the functional layer 50 formed thereon is disposed in the forming mold 40 such that the functional layer 50 faces the internal space 44 of the forming mold 40. In the third process, the internal space 44 is filled with a resin, thereby molding the resin molded body 10a to which the sheet 30 and the functional layer 50 have been adhered. In the fourth process, by causing the sheet 30 to peel off from the functional layer 50 in a state in which the functional layer 50 is adhered to the resin molded body 10a, the smooth surface (second smooth surface) 51 having the maximum height roughness Rz of 3 μm or less of the functional layer 50 is exposed. In the fifth process, the wiring 20 is formed on the smooth surface 51 using the fluid conductive ink.

With the aforementioned configuration, it is possible to suppress an increase in manufacturing costs and to suppress variations in width of the wiring 20 similarly to the first embodiment. Further, it is possible to easily form the functional layer 50 between the resin molded body 10a and the wiring 20. Therefore, it is possible to suppress manufacturing costs for forming the functional layer 50.

Also, the resin structure 1a according to the second embodiment includes the resin molded body 10a, the functional layer 50 that is formed on the first region 11a that is a part of the surface of the resin molded body 10a, and the wiring 20 that is formed on the functional layer 50. The surface of the functional layer 50 on which the wiring 20 is formed is the smooth surface 51 having the maximum height roughness Rz of 3 μm or less. The maximum height roughness Rz of the second region 12 of the surface of the resin molded body 10a that is adjacent to the first region 11a is more than 3 μm. The step difference 13a due to which the smooth surface 51 is lower than the second region 12 is formed at the boundary between the first region 11a and the second region 12.

It is possible to easily check the boundary between the first region 11a and the second region 12 with the step difference 13a. Therefore, it is possible to prevent the wiring 20 from being erroneously formed in the second region 12.

The functional layer 50 is, for example, a high dielectric layer having a specific permittivity of 5 or more. In this manner, it is possible to shorten the wavelength of the signal to be transmitted through the wiring 20.

The embodiments disclosed herein are to be considered as having been described for illustrative purposes instead of restrictive purposes in terms of all points. The scope of the invention is represented by claims rather than the above description and is intended to include all modifications within meanings and a scope equivalent to the claims.

REFERENCE SIGNS LIST 1, 1a, 100 Resin structure
10, 10a, 110 Resin molded body
11, 11a First region
12 Second region
13, 13a Step difference
20, 120 Wiring
21 Solvent
22 Thin part
30 Sheet
31, 51 Smooth surface
40 Forming mold
41 Upper mold
42 Lower mold
43 Surface
44 Internal space
50 Functional layer
112 Upper surface

What is claimed is:

1. A resin structure comprising:
a resin molded body; and
a wiring that is formed on a surface of the resin molded body,
wherein the surface of the resin molded body comprises a first region having a maximum height roughness Rz of 3 μm or less and a second region that is adjacent to the first region and has a maximum height roughness Rz of more than 3 μm,
a step difference due to which the first region is lower than the second region is formed at a boundary between the first region and the second region, and
the wiring is formed on the first region.

2. A resin structure comprising:
a resin molded body;
a functional layer that is formed on a first region that is a portion of a surface of the resin molded body; and
a wiring that is formed on the functional layer,
wherein the surface of the functional layer on which the wiring is formed is a smooth surface having a maximum height roughness Rz of 3 μm or less,
a maximum height roughness Rz in a second region that is adjacent to the first region on the surface of the resin molded body is more than 3 μm, and
a step difference due to which the smooth surface is lower than the second region is formed at a boundary between the first region and the second region.

3. The resin structure according to claim 2, wherein the functional layer is a dielectric layer having a specific permittivity of 5 or more.

4. A method for manufacturing a resin structure comprising:
a step for arranging a sheet having a smooth surface having a maximum height roughness Rz of 3 μm or less, inside a forming mold such that the smooth surface faces an internal space of the forming mold;
a step for molding a resin molded body to which the sheet is adhered, by filling the internal space with a resin;
a step for separating the resin molded body from the sheet, thereby forming a region having a maximum height roughness Rz of 3 μm or less on at least a portion of a surface of the resin molded body; and
a step for using a fluid conductive ink to form a wiring on the region.

5. The method for manufacturing a resin structure according to claim 4, wherein in the step for forming the wiring, the conductive ink is ejected by ink-jet printing.

6. The method for manufacturing a resin structure according to claim 5, wherein when a tensile stress of 100 kgf/cm$^2$ is applied to the sheet in an environment at 120° C., an extension rate of the sheet is 1% or less, and an amount of deformation of the sheet in a thickness direction is 10% or less.

7. The method for manufacturing a resin structure according to claim 5, wherein the sheet has a thickness of 50 to 120 μm and is made of polyethylene terephthalate.

8. The method for manufacturing a resin structure according to claim 4, wherein when a tensile stress of 100 kgf/cm$^2$ is applied to the sheet in an environment at 120° C., an extension rate of the sheet is 1% or less, and an amount of deformation of the sheet in a thickness direction is 10% or less.

9. The method for manufacturing a resin structure according to claim 8, wherein the sheet has a thickness of 50 to 120 μm and is made of polyethylene terephthalate.

10. The method for manufacturing a resin structure according to claim 4, wherein the sheet has a thickness of 50 to 120 μm and is made of polyethylene terephthalate.

11. A method for manufacturing a resin structure comprising:
a step for forming a functional layer on a first smooth surface having a maximum height roughness Rz of 3 μm or less of a sheet having the first smooth surface;
a step for arranging the sheet with the functional layer formed thereon inside a forming mold such that the functional layer faces an internal space of the forming mold;
a step for molding a resin molded body to which the sheet and the functional layer are adhered, by filling the internal space with a resin;
a step for separating the functional layer from the sheet in a state in which the functional layer is adhered to the resin molded body, thereby exposing a second smooth surface having a maximum height roughness Rz of 3 μm or less of the functional layer; and
a step for using a fluid conductive ink to form a wiring on the second smooth surface.

12. The method for manufacturing a resin structure according to claim 11, wherein the functional layer is a dielectric layer having a specific permittivity of 5 or more.

13. The method for manufacturing a resin structure according to claim 12, wherein in the step for forming the wiring, the conductive ink is ejected by ink-jet printing.

14. The method for manufacturing a resin structure according to claim 13, wherein when a tensile stress of 100 kgf/cm$^2$ is applied to the sheet in an environment at 120° C., an extension rate of the sheet is 1% or less, and an amount of deformation of the sheet in a thickness direction is 10% or less.

15. The method for manufacturing a resin structure according to claim 12, wherein when a tensile stress of 100 kgf/cm$^2$ is applied to the sheet in an environment at 120° C., an extension rate of the sheet is 1% or less, and an amount of deformation of the sheet in a thickness direction is 10% or less.

16. The method for manufacturing a resin structure according to claim 12, wherein the sheet has a thickness of 50 to 120 μm and is made of polyethylene terephthalate.

17. The method for manufacturing a resin structure according to claim 11, wherein in the step for forming the wiring, the conductive ink is ejected by ink-jet printing.

18. The method for manufacturing a resin structure according to claim 17, wherein when a tensile stress of 100 kgf/cm$^2$ is applied to the sheet in an environment at 120° C., an extension rate of the sheet is 1% or less, and an amount of deformation of the sheet in a thickness direction is 10% or less.

19. The method for manufacturing a resin structure according to claim 11, wherein when a tensile stress of 100 kgf/cm$^2$ is applied to the sheet in an environment at 120° C., an extension rate of the sheet is 1% or less, and an amount of deformation of the sheet in a thickness direction is 10% or less.

20. The method for manufacturing a resin structure according to claim 11, wherein the sheet has a thickness of 50 to 120 μm and is made of polyethylene terephthalate.

* * * * *